(12) United States Patent
Horibe et al.

(10) Patent No.: US 9,859,131 B2
(45) Date of Patent: Jan. 2, 2018

(54) DESMEAR TREATMENT DEVICE AND DESMEAR TREATMENT METHOD

(71) Applicant: Ushio Denki Kabushiki Kaisha, Tokyo (JP)

(72) Inventors: Hiroki Horibe, Tokyo (JP); Tomoyuki Habu, Tokyo (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/316,806

(22) PCT Filed: May 22, 2015

(86) PCT No.: PCT/JP2015/064691
§ 371 (c)(1),
(2) Date: Dec. 6, 2016

(87) PCT Pub. No.: WO2015/190263
PCT Pub. Date: Dec. 17, 2015

(65) Prior Publication Data
US 2017/0154791 A1    Jun. 1, 2017

(30) Foreign Application Priority Data

Jun. 13, 2014    (JP) ................................. 2014-122227

(51) Int. Cl.
*B08B 7/00*    (2006.01)
*B08B 7/04*    (2006.01)
(Continued)

(52) U.S. Cl.
CPC ............ *H01L 21/4864* (2013.01); *B08B 5/00* (2013.01); *B08B 7/0057* (2013.01); *B08B 7/04* (2013.01)

(58) Field of Classification Search
CPC ..... H01L 21/4864; B08B 5/00; B08B 7/0057; B08B 7/04
See application file for complete search history.

(56) References Cited

U.S. PATENT DOCUMENTS 6,616,773 B1 * 9/2003 Kuzumoto ................ B08B 7/00
                                                          134/1.3
2003/0086821 A1 * 5/2003 Matthews .................. A61L 2/10
                                                          422/29

(Continued)

FOREIGN PATENT DOCUMENTS

JP    H04-302145 A    10/1992
JP    H08-180157 A    7/1996

(Continued)

OTHER PUBLICATIONS

International Search Report issued in PCT/JP2015/064691; dated Jul. 28, 2015.

(Continued)

*Primary Examiner* — Alexander Markoff
(74) *Attorney, Agent, or Firm* — Studebaker & Brackett PC

(57) ABSTRACT

The present invention has as its object the provision of a desmear treatment device and a desmear treatment method capable of reliably performing a desmear treatment with high treatment efficiency. In the desmear treatment method of the present invention, when irradiating a to-be-treated object disposed in a treatment space with vacuum ultraviolet rays via an ultraviolet transmitting window member to remove smear in the to-be-treated object, a treatment gas containing active species to be activated by the irradiation of the vacuum ultraviolet rays and having contained moisture is supplied into the treatment space. The desmear treatment device includes treatment gas supply means having a humidifying mechanism for causing a treatment gas con- (Continued)

taining active species to be activated by vacuum ultraviolet rays from an ultraviolet light source to contain moisture.

4 Claims, 1 Drawing Sheet

(51) Int. Cl.
*H01L 21/48* (2006.01)
*B08B 5/00* (2006.01)

(56) References Cited

U.S. PATENT DOCUMENTS

| | | | | |
|---|---|---|---|---|
| 2004/0159335 | A1* | 8/2004 | Montierth | B08B 3/08 134/10 |
| 2005/0241673 | A1* | 11/2005 | Endo | G03F 7/423 134/1.3 |
| 2006/0102210 | A1* | 5/2006 | Chouno | H01L 21/67748 134/148 |
| 2006/0257751 | A1* | 11/2006 | Eggers | B82Y 30/00 430/5 |
| 2009/0260656 | A1* | 10/2009 | Higashijima | H01L 21/6719 134/18 |
| 2016/0329223 | A1* | 11/2016 | Hirose | H01L 21/67115 |

FOREIGN PATENT DOCUMENTS

| | | |
|---|---|---|
| JP | 2001-223206 A | 8/2001 |
| JP | 2002-110611 A | 4/2002 |
| JP | 2005-336615 A | 12/2005 |
| JP | 2010-205801 A | 9/2010 |

OTHER PUBLICATIONS

An Office Action; "Notification of Reasons for Refusal", issued by the Japanese Patent Office dated Jul. 10, 2015, which corresponds to Japanese Patent Application No. 2014-122227.

An Office Action; "Notification of Reasons for Refusal", issued by the Japanese Patent Office dated Oct. 30, 2015, which corresponds to Japanese Patent Application No. 2014-122227.

An Office Action; "Decision of Refusal", issued by the Japanese Patent Office dated Mar. 1, 2016, which corresponds to Japanese Patent Application No. 2014-122227.

An Office Action; "Decision of Grant", issued by the Japanese Patent Office dated Jul. 26, 2016, which corresponds to Japanese Patent Application No. 2014-122227.

* cited by examiner

DESMEAR TREATMENT DEVICE AND DESMEAR TREATMENT METHOD

TECHNICAL FIELD

The present invention relates to a desmear treatment device and a desmear treatment method for removing, through the use of ultraviolet rays, smear (residue) in a board material in a manufacturing process of a wiring board.

BACKGROUND ART

A multilayer wiring board in which insulating layers and conductive layers (wiring conductors) are layered in an alternate manner has been known as an example of a wiring board for mounting a semiconductor element such as a semiconductor integrated circuit element. In such a multilayer wiring board, a via hole or a through-hole passing through one or more insulating layers in a thickness direction thereof is formed to electrically connect one conductive layer to another conductive layer.

In a manufacturing process of the multilayer wiring board, an upper resin insulating layer 63, which contains a conductive layer (wiring conductor) 62 as illustrated in FIG. 2(a), is formed on a lower resin insulating layer 61. Next, laser machining is performed to remove parts of the resin insulating layer 63 and the conductive layer 62, thus forming a via hole 65 or a through-hole as illustrated in FIG. 2(b). When the via hole 65 or the through-hole is formed, smear (residue) S, resulting from the material of the upper resin insulating layer 63, remains on an inner side of the via hole 65 or in the vicinity thereof. If the smear S is left unremoved, the formation of the conductive layer 62 on the inner side of the via hole 65 may fail to establish sufficient electrical conduction by the conductive layer 62. Thus, a desmear treatment for removing the smear S is performed to obtain a state in which the upper surface of the conductive layer 62 is exposed as illustrated in FIG. 2(c).

A wet desmear treatment method has been known in the art as an example of desmear treatment methods for wiring board materials.

The wet desmear treatment method is a method for removing smear remaining in a wiring board material by immersing the wiring board material into an alkaline solution, which is prepared by dissolving potassium permanganate or sodium hydroxide, to dissolve or peel off the smear (see Patent Literature 1, for example).

The wet desmear treatment method, however, has a problem of a considerably high desmear treatment cost. The reasons for this include lowered throughput due to the need to clean and neutralize the wiring board material after being immersed into the alkaline solution, the need to perform liquid waste disposal of the used alkaline solution, etc.

Moreover, with an increasing demand for finer wiring patterns in wiring boards in recent years, via holes with smaller diameters have been required to be formed. When the desmear treatment is performed on a wiring board material having a via hole with a small diameter, the alkaline solution fails to sufficiently penetrate into the via hole. Thus, it is difficult to perform the required desmear treatment reliably.

According to a dry desmear treatment method, in contrast, it can be expected to perform the desmear treatment in a short amount of time. Additionally, cost for the desmear treatment can be reduced since there is no need to perform the cleaning and neutralization of a wiring board material and the liquid waste disposal. Furthermore, the dry desmear treatment method can be used for a wiring board material having a via hole with a small diameter (see Patent Literature 2, for example).

As an example of the dry desmear treatment method, may be mentioned a method according to which a wiring board material is irradiated with vacuum ultraviolet rays with a wavelength of not higher than 200 nm under an atmosphere in which oxygen exists to decompose and remove smear. With a method utilizing active oxygen, such as ozone, produced by vacuum ultraviolet rays emitted from an excimer lamp, in particular, it can be expected to perform the predetermined treatment more efficiently and in a short amount of time.

CITATION LIST

Patent Literature

Patent Literature 1: Japanese Patent Application Laid-Open No. 2010-205801
Patent Literature 2: Japanese Patent Application Laid-Open No. Hei. 08-180757

SUMMARY OF INVENTION

Technical Problem

In such a desmear treatment method, if the irradiation of vacuum ultraviolet rays is performed for a long period of time in order to reliably perform the desmear treatment, even an insulating layer, which essentially should not be decomposed, is decomposed. If the insulating layer is excessively decomposed to lose its insulating function, function as a wiring board can no longer be fulfilled. If an integrated irradiation amount of ultraviolet rays is underestimated in order to protect the insulating layer, smear cannot be removed completely, thus resulting in insufficient electrical conduction of the wiring conductor via the via hole.

As described above, how to treat smear without affecting the insulating layer is a challenge in the desmear treatment of the wiring board material. In other words, a new treatment device and treatment method capable of reliably treating smear in a short amount of time have been demanded.

As a result of earnest study by the present inventors, it has been found out that a desmear treatment can be performed at a higher treatment speed when a moisture-containing (humidified) treatment gas is supplied while irradiating a wiring board material with vacuum ultraviolet rays than when a non-moisture-containing treatment gas is supplied.

It has been also found out that an excessive amount of moisture contained in the treatment gas slows down the treatment speed, i.e., an appropriate range exists in the amount of moisture contained in the treatment gas.

The present invention has as its object the provision of a desmear treatment device and a desmear treatment method capable of reliably performing a desmear treatment with high treatment efficiency.

Solution to Problem

According to the present invention, there is provided a desmear treatment device including: an ultraviolet light source for emitting vacuum ultraviolet rays; a light irradiation chamber in which the ultraviolet light source is housed; a treatment chamber having a treatment space where a to-be-treated object is disposed; an ultraviolet transmitting window member for separating an inner space of the light irradiation chamber from the treatment space of the treatment chamber; and treatment gas supply means for supplying a treatment gas into the treatment space, wherein the treatment gas supply means includes a humidifying mechanism for causing a treatment gas, containing active species to be activated by the vacuum ultraviolet rays from the ultraviolet light source, to contain moisture and supplies the treatment gas humidified by the humidifying mechanism into the treatment space.

According to the present invention, there is provided a desmear treatment method for removing smear in a to-be-treated object disposed in a treatment space of a treatment chamber. The method includes irradiating the to-be-treated object with vacuum ultraviolet rays from an ultraviolet light source housed in a light irradiation chamber having an internal space separated from the treatment space of the treatment chamber by an ultraviolet transmitting window member via the window member to remove the smear in the to-be-treated object, wherein a treatment gas obtained by causing a treatment gas containing active species to be activated by the irradiation of the vacuum ultraviolet rays to contain moisture is supplied into the treatment space.

In the desmear treatment method of the present invention, an absolute humidity by volume of the treatment gas may preferably be within a range of 10 to 70 g/m$^3$.

Advantageous Effects of Invention

According to the present invention, in addition to the vacuum ultraviolet rays irradiated onto the to-be-treated object and the active species produced by irradiating the treatment gas with the vacuum ultraviolet rays, hydroxyl radicals (OH—), which are produced by irradiating the moisture contained in the treatment gas with the vacuum ultraviolet rays, can contribute to the decomposition and removal of the smear. Thus, treatment efficiency can be improved.

Moreover, controlling the amount of moisture (absolute humidity by volume) contained in the treatment gas can prevent the light quantity of vacuum ultraviolet rays irradiated onto the to-be-treated object from being significantly reduced. Thus, desmearing effect can be obtained in a stable manner.

DESCRIPTION OF EMBODIMENTS

An embodiment of the present invention will be described below in detail.

Figure 1:
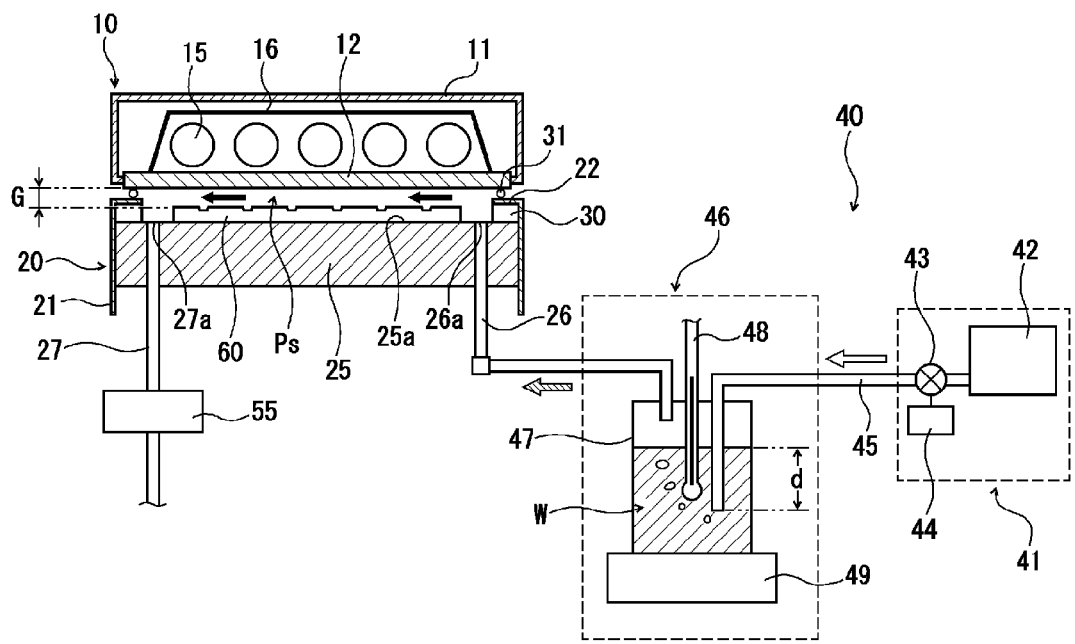
FIG. 1 is a sectional view illustrating the general construction of a main part of an exemplary desmear treatment device of the present invention.

FIG. 1 is a sectional view illustrating the general construction of a main part of an exemplary desmear treatment device of the present invention.

The desmear treatment device includes a light irradiation chamber 10 that houses an ultraviolet light source and a treatment chamber 20 in which a to-be-treated object 60 is disposed.

Figure 2A:
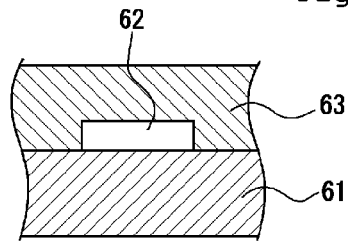
FIGS. 2(a) to 2(c) include several sectional views schematically illustrating an example of a manufacturing process of a multilayer wiring board.
Figure 2B:
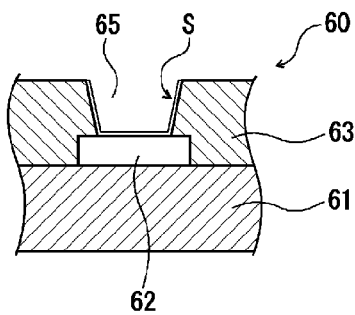
Figure 2C:
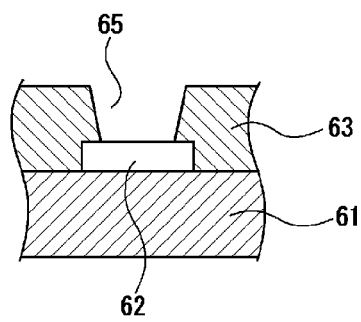

To explain with reference to FIG. 2(b), the to-be-treated object 60 is, for example, a wiring board material in which a conductive layer (wiring conductor) 62 is layered on one surface of a resin insulating layer 61 and a resin insulating layer 63 provided with a via hole 65 is layered on one surface of the conductive layer 62. Smear S, derived from the resin insulating layer 63 and inevitably formed in the manufacturing process, remains in the wiring board material.

The light irradiation chamber 10 includes a housing 11 in the shape of a generally rectangular parallelepiped box with an opening on a lower side thereof. The opening of the housing 11 is airtightly provided with an ultraviolet transmitting window member 12 in the shape of a flat plate. As an example of the material for forming the window member 12, may be mentioned quartz glass.

Inside the housing 11, a plurality of rod-shaped ultraviolet lamps 15, which are ultraviolet light sources, are disposed side by side so that the central axes thereof extend parallel to one another in the same horizontal plane. A reflecting mirror 16 is provided at a position above these ultraviolet lamps 15.

Moreover, the housing 11 is provided with inert gas purging means (not shown) for purging an inert gas such as a nitrogen gas.

Publicly known various lamps may be used as the ultraviolet lamp 15 as long as the lamp can emit vacuum ultraviolet rays. Specifically, as examples of the ultraviolet lamp 15 used, may be mentioned a xenon excimer lamp that emits vacuum ultraviolet rays with a center wavelength, for example, of 172 nm, a low-pressure mercury lamp that emits ultraviolet rays having a peak wavelength of 185 nm and a deuterium lamp that emits ultraviolet rays with a wavelength of 180 to 370 nm. Among these, the xenon excimer lamp is preferably used from the viewpoint of having a high vacuum ultraviolet intensity and being able to efficiently produce active species.

The treatment chamber 20 includes a housing 21 in the shape of a rectangular frame that is opened upwardly and downwardly. A treatment stage 25 having a flat to-be-treated object placement surface 25a is disposed inside the housing 21, by being inserted from the lower-side opening of the housing 21, so as to airtightly fill up the lower-side opening of the housing 21.

An upper end portion of the housing 21 that protrudes above the to-be-treated object placement surface 25a of the treatment stage 25 is provided with a light irradiation chamber supporting part 22 that extends inwardly along the to-be-treated object placement surface 25a. The reference numeral 30 in FIG. 1 represents a spacer member for fixing a clearance between the window member 12 in the light irradiation chamber 10 and the treatment stage 25 to a certain magnitude. A periphery of a light outputting surface (lower surface) of the window member 12 provided in the housing 11 of the light irradiation chamber 10 is airtightly disposed on an upper surface of the light irradiation chamber supporting part 22 via a sealing member 31 in the shape of a rectangular frame. This forms a treatment space Ps where the to-be-treated object 60 is disposed, which is separated from the internal space of the light irradiation chamber 10 by the window member 12.

The treatment stage 25 is provided with a through hole for supplying a treatment gas and a through hole for discharging a gas, both extending in the thickness direction of the treatment stage 25 and having a supply port 26a and a discharge port 27a, respectively, which are opened to the treatment space Ps. The through hole for supplying a treatment gas and the through hole for discharging a gas are formed at positions spaced apart from each other in the direction along which the ultraviolet lamps 15 are arranged, for example, and the to-be-treated object 60 is disposed at a position between the supply port 26a and the discharge port 27a.

The supply port 26a of the through hole for supplying a treatment gas and the discharge port 27a of the through hole for discharging a gas each have an opening shape such as an elongated slit-shaped long hole extending along the lamp central axes of the ultraviolet lamps 15.

Moreover, an opening area of the discharge port 27a is preferably larger than an opening area of the supply port 26a. Such a construction prevents the stagnation of the treatment gas in the treatment space Ps, thus allowing for stable formation of a unidirectional uniform flow from the supply port 26a toward the discharge port 27a. Thus, the treatment gas spreads over the entire to-be-treated object 60 in a surface direction thereof, thereby preventing the occurrence of unevenness in the treatment.

A dimension G of a clearance between a surface of the to-be-treated object 60 and the light outputting surface of the window member 12 is set to not higher than 1 mm, for example, preferably 0.3 to 1.0 mm. As a result of the dimension G of the clearance between the surface of the to-be-treated object 60 and the light outputting surface of the window member 12 being not higher than 1 mm, ozone and active species (active oxygen) can be stably produced and vacuum ultraviolet rays reaching the surface of the to-be-treated object 60 can have a sufficient intensity (light quantity).

Such a light irradiation device includes treatment gas supply means 40 for supplying a treatment gas used for performing a desmear treatment into a gap between the to-be-treated object 60 disposed in the treatment chamber 20 and the window member 12.

The treatment gas supply means 40 includes a treatment gas supply mechanism 41 for supplying a dry treatment gas containing a source of active species to be activated by vacuum ultraviolet rays from the ultraviolet lamps 15 and a humidifying mechanism 46 for causing the treatment gas to contain moisture. The treatment gas supply means 40 supplies a treatment gas, which has been humidified by the humidifying mechanism 46 to have a controlled absolute humidity by volume, into the treatment space Ps of the treatment chamber 20.

The treatment gas supply mechanism 41 includes a gas supply source 42 such as a gas tank (gas cylinder), a flow control valve 43 for controlling a flow rate of a gas supplied from the gas supply source 42 and control means 44 for controlling opened and closed states of the flow control valve 43.

An oxygen gas, a mixed gas in which ozone is mixed into an oxygen gas or a mixed gas in which an inert gas such as a nitrogen gas is mixed into an oxygen gas, for example, may be used as the treatment gas.

An oxygen concentration in the treatment gas is preferably not lower than 50% by volume, for example, more preferably not lower than 70% by volume, and particularly preferably not lower than 90% by volume. The oxygen concentration not lower than 50% by volume can increase amounts of ozone and active species produced by vacuum ultraviolet rays, thus allowing for reliable accomplishment of the desired treatment.

The humidifying mechanism 46 in this example includes, for example, a humidifying tank 47, which includes a sealed container, temperature measuring means 48 for measuring a water temperature in the humidifying tank 47 and heating means 49 disposed on an outer surface of a bottom wall of the humidifying tank 47 and including a hot plate, for example. Pure water W, for example, is retained in the humidifying tank 47 so that a space is formed between an inner surface of an upper wall of the sealed container and a water surface. A treatment gas supply pipe 45 connected to the gas supply source 42 via the flow control valve 43 in the treatment gas supply mechanism 41 is provided so that a tip opening thereof is positioned in the water. Also, a treatment gas supply pipe 26 connected to the through hole for supplying a treatment gas in the treatment stage 25 is provided so that a tip opening thereof is positioned in the space in the humidifying tank 47. Here, the position (bubbling position) of an opening end face of the treatment gas supply pipe 45 from the water surface is maintained so that a distance d between the opening end face of the treatment gas supply pipe 45 and the water surface has a fixed magnitude.

In the desmear treatment device, a discharge pipe 27 connected to the through hole for discharging a gas in the treatment stage 25 is provided with a dew-point instrument 55 for measuring a dew-point temperature of the gas discharged from the treatment space Ps. On the basis of the dew-point temperature measured by the dew-point instrument 55, the absolute humidity by volume of the treatment gas is calculated by control mechanism (not shown). On the basis of the result, an amount of moisture to be contained in the treatment gas is controlled.

In the desmear treatment device in this example, the water temperature in the humidifying tank 47 of the humidifying mechanism 46 is adjusted on the basis of the calculated absolute humidity by volume, and thus the amount of moisture (amount of water vapor) to be contained in the treatment gas is adjusted. The treatment gas, thus controlled to have an appropriate absolute humidity by volume, is supplied by the treatment gas supply means 40.

The absolute humidity by volume (amount of water vapor) of the treatment gas can be set in consideration of the light transmittance of the treatment gas to vacuum ultraviolet rays. This is because a higher absolute humidity by volume (amount of water vapor) of the treatment gas results in reduced light transmittance of the treatment gas to vacuum ultraviolet rays and thus results in deteriorated etching effect obtained by the vacuum ultraviolet rays themselves as shown by the results of an experimental example to be described later.

Specifically, the absolute humidity by volume (amount of water vapor) of the treatment gas is preferably 10 to 70 $g/m^3$, for example. When the absolute humidity by volume (amount of water vapor) of the treatment gas is 10 to 70 $g/m^3$, treatment efficiency can be improved as compared to a case where a non-moisture-containing treatment gas (the absolute humidity by volume is 0 $g/m^3$) is used. If the absolute humidity by volume exceeds 70 $g/m^3$, on the other hand, it becomes difficult to obtain sufficient etching effect by vacuum ultraviolet rays. Thus, treatment efficiency becomes lower than the case where the non-moisture-containing treatment gas (the absolute humidity by volume is 0 $g/m^3$) is used.

A desmear treatment method conducted with the aforementioned desmear treatment device will be described below.

In the desmear treatment device, the treatment gas having a controlled absolute humidity by volume (it is represented by a hatched arrow in FIG. 1) is supplied by the treatment gas supply means 40 into the treatment space Ps of the treatment chamber 20 via the supply port 26a. In the treatment gas supply means 40, the treatment gas (it is represented by a hollow arrow in FIG. 1) supplied by the treatment gas supply mechanism 41 at an appropriately-controlled gas flow rate is bubbled in the water retained in the humidifying tank 47 of the humidifying mechanism 46. This causes the treatment gas to contain a predetermined amount of moisture and the humidified treatment gas is supplied into the treatment space Ps of the treatment chamber 20. Here, the temperature of the pure water W retained in the humidifying tank 47 has been heated to a predetermined temperature set on the basis of the dew-point temperature measured by the dew-point instrument 55. Consequently, the amount of moisture to be contained in the treatment gas (absolute humidity by volume of the treatment gas to be supplied) is controlled.

The treatment gas supplied into the treatment space Ps of the treatment chamber 20 flows along the surface of the to-be-treated object 60 and the light outputting surface of the window member 12 in the gap between the surface of the to-be-treated object 60 and the light outputting surface of the window member 12 and then is discharged from the treatment space Ps via the discharge port 27a.

Inert gas supply means (not shown), on the other hand, supplies an inert gas such as a nitrogen gas into the light irradiation chamber 10. The inert gas flows through the light irradiation chamber 10 to replace the atmosphere in the light irradiation chamber 10 with an inert gas atmosphere.

Under such a condition, the plurality of ultraviolet lamps 15 in the light irradiation chamber 10 are lighted all together to irradiate the surface of the to-be-treated object 60 via the window member 12 with vacuum ultraviolet rays from the ultraviolet lamps 15. The treatment gas in which the source of active species has been activated by the irradiation of the vacuum ultraviolet rays (hereinafter, it is referred to as a "gas containing active species," and In FIG. 1, it is represented by a filled-in arrow) enters into the via hole 65 of the to-be-treated object 60. Consequently, the smear S remaining in the via hole 65 of the to-be-treated object 60 is decomposed and removed by the actions of the vacuum ultraviolet rays reaching the surface of the to-be-treated object 60 and the ozone and active species (active oxygen) in the gas containing active species.

An integrated light quantity of vacuum ultraviolet rays irradiated onto the to-be-treated object 60 is appropriately set in consideration of the residual state of the smear S, for example. An example of such an integrated light quantity is 30 to 120 J/cm$^2$. Note that the desmear treatment as described above is performed while being continuously supplied with the inert gas and the treatment gas.

A reaction product gas, such as a carbon dioxide gas, produced by the decomposition and removal of the smear S is discharged from the treatment space Ps via the discharge port 27a along with the flow of the streaming gas containing active species.

According to the aforementioned desmear treatment method, the treatment gas supplied into the treatment space Ps has been humidified to have a controlled absolute humidity by volume. Consequently, hydroxyl radicals (OH—) are produced by the irradiation of the vacuum ultraviolet rays from the ultraviolet lamps 15, thus allowing the hydroxyl radicals to contribute to the decomposition and removal of the smear. Thus, the action of the hydroxyl radicals can be obtained in addition to the etching effect by the vacuum ultraviolet rays and the actions of the active species, such as oxygen radicals, generated by the activation of the source of active species in the treatment gas and ozone. This can improve treatment efficiency as compared to the case where the non-moisture-containing treatment gas (the absolute humidity by volume is 0 g/m$^3$) is used.

Moreover, controlling the amount of moisture (absolute humidity by volume) contained in the treatment gas can prevent the light quantity of vacuum ultraviolet rays irradiated onto the to-be-treated object 60 from being significantly reduced. Thus, desmearing effect can be obtained in a stable manner.

According to the above-described desmear treatment device with which such a desmear treatment method is conducted, a desired desmear treatment can be reliably performed with high treatment efficiency.

While the embodiment of the present invention has been described above, the present invention is not limited to the above-described embodiment and various modifications can be made thereto.

For example, the humidifying mechanism in the treatment gas supply means may be an ultrasonic humidifying mechanism without being limited to the bubbling humidifying mechanism.

A source of active species preferably used in the conventional techniques can be utilized as the source of active species contained in the treatment gas as long as the source can produce active species by receiving the irradiation of vacuum ultraviolet rays. For example, air, a carbon monoxide gas, a carbon dioxide gas, or the like may be used.

Furthermore, the desmear treatment device of the present invention is preferably configured to perform the desmear treatment while temperature of a surface of a to-be-treated object is raised.

Specifically, the treatment stage can be configured to include a heating mechanism for heating a to-be-treated object. Since such a configuration can promote the actions by ozone and active species along with an increase in the temperature of the surface of the to-be-treated object, the treatment can be performed efficiently.

Furthermore, similar effect can be obtained by heating the treatment gas and flowing the temperature-raised treatment gas through the treatment space to raise the temperature of the surface of the to-be-treated object.

As a heating condition, the temperature of the surface of the to-be-treated object is preferably not lower than 80° C. and not more than 340° C., for example, more preferably not lower than 80° C. and not more than 200° C.

The experimental example performed to confirm the effects of the present invention will be described below.

Experimental Example 1

With reference to the construction illustrated in FIG. 1, the desmear treatment device according to the present invention was manufactured. Specifications of this desmear treatment device are as follows.

To-Be-Treated Object (60):

A test wiring board material in which an insulating layer with a via hole is layered on a copper foil Planar dimension: 500 mm×500 mm, thickness of the copper foil: 35 μm, thickness of the insulating layer: 30 μm, diameter of the bottom surface of the via hole: φ50 μm Ultraviolet Light Source:

Formed by 5 ultraviolet lamps (15)

Ultraviolet lamp (15): xenon excimer lamp with an emission length of 700 mm and a maximum outer diameter of 40 mm (main emission wavelength is 172 nm)

Arrangement pitch of the ultraviolet lamps (15) (distance between the central axes of adjacent ultraviolet lamps): 60 mm Rated input power: 500 W
Integrated light quantity on the surface of the test wiring board material: 16.2 J/cm²
Ultraviolet irradiation time: 150 sec
Window Member (12):
    Material: synthetic quartz glass, thickness: 5 mm
Treatment Chamber (20):
    Dimension of the treatment stage (25): 650 mm×650 mm, thickness of 20 mm
    Dimension of the supply port (26a) in the arrangement direction of the ultraviolet lamps: 3 mm, dimension of the ultraviolet lamp in the direction of the lamp central axis: 600 mm
    Dimension of the discharge port (27a) in the arrangement direction of the ultraviolet lamps is 10 mm, dimension of the ultraviolet lamp in the direction of the lamp central axis: 600 mm
    Heating means: resistance heating heater that operates under a heating condition in which the temperature of the to-be-treated surface of the to-be-treated object is 120° C.
    Clearance (G) between the light outputting surface of the window member (12) and the surface of the to-be-treated object (60): 0.3 mm
    Volume of the treatment space (Ps): about 100 cm³
Treatment Gas Supply Means (40):
    Treatment gas: dry oxygen gas (concentration is 100% by volume, absolute humidity by volume is 0 g/m³)
    Height (d) of the liquid surface from the opening surface of the treatment gas supply pipe (45): 300 mm
    Supplied amount of the treatment gas: 0.03 liter/min
Such a desmear treatment device was used to perform the desmear treatment of the test wiring board material while appropriately adjusting the absolute humidity by volume of the treatment gas to be supplied into the treatment space within a range of 0 to 95 g/m³. The adjustment of the absolute humidity by volume of the treatment gas (amount of moisture contained in the gas for forming a treatment atmosphere) was performed by adjusting water temperature in the humidifying tank (47). The absolute humidity by volume was calculated on the basis of the dew-point temperature of the treatment gas introduced into the treatment space (Ps), which was measured by the dew-point instrument (55) attached to the discharge pipe (27). Note that the aforementioned ultraviolet irradiation conditions are set so that the smear of the test wiring board material remains on purpose after the desmear treatment.

The bottom of the via hole in the test wiring board material having undergone the desmear treatment was then observed with a scanning electron microscope to quantify and evaluate the degree of the remaining smear. The results are shown in Table 1 below together with the transmittance of the treatment gas to vacuum ultraviolet rays with a wavelength of 172 nm.

The evaluation on the degree of the remaining smear was performed as follows. First, a SEM image for the bottom of the via hole after the desmear treatment, obtained by the scanning electron microscope, was binarized to obtain the area of the entire bottom of the via hole and the area of a region where smear remained (region that appears black in the SEM image). Thereafter, (the area of the region where smear remained)/(the area of the entire bottom of the via hole) was calculated as a "via bottom smear area" (%). Here, the via bottom smear area in the test wiring board material before being subjected to the desmear treatment is 100%, for example. When desmearing was perfectly completed, on the other hand, the via bottom smear area is 0%. As mentioned above, the ultraviolet irradiation time is set to a certain period of time in the present experiment so as to stop the desmear treatment before the smear in the test wiring board material is completely removed. Therefore, a smaller value of the via bottom smear area represents a faster smear treating speed.

TABLE 1

| ABSOLUTE HUMIDITY BY VOLUME [g/m³] | VIA BOTTOM SMEAR AREA [%] | LIGHT TRANSMITTANCE [%] |
|---|---|---|
| 0 | 60.0 | 61.8 |
| 9.4 | 58.2 | 60.5 |
| 27.2 | 49.6 | 54.4 |
| 39.3 | 47.4 | 51.1 |
| 51.0 | 49.6 | 48.0 |
| 70.0 | 59.1 | 43.0 |
| 75.3 | 63.4 | 41.2 |
| 94.9 | 79.3 | 36.0 |

From the above results, it was confirmed that the smear treating speed was faster when the treatment gas containing moisture to have an absolute humidity by volume of 10 g/m³ to 70 g/m³ was used than when the non-moisture-containing treatment gas (the absolute humidity by volume is 0 g/m³) was used. It was also confirmed that an excessive amount of moisture contained in the treatment gas conversely slowed down the smear treating speed. The reason for this can be considered as follows. Specifically, an excessive amount of moisture contained in the treatment gas lowers the transmittance of light from the xenon excimer lamp (light with a wavelength of 172 nm). This results in the reduction of the etching effect obtained by vacuum ultraviolet rays themselves and the inhibition of the generation of other active species (oxygen radicals), thus failing to obtain the action of such active species. This is assumed to be the reason.

REFERENCE SIGNS LIST 10 light irradiation chamber
11 housing
12 window member
15 ultraviolet lamp
16 reflecting mirror
20 treatment chamber
21 housing
22 light irradiation chamber supporting part
25 treatment stage
25a to-be-treated object placement surface
26 treatment gas supply pipe
26a supply port
27 discharge pipe
27a discharge port
30 spacer member
31 sealing member
40 treatment gas supply means
41 treatment gas supply mechanism
42 gas supply source
43 flow control valve
44 control means
45 treatment gas supply pipe
46 humidifying mechanism
47 humidifying tank
48 temperature measuring means
49 heating means
55 dew-point instrument
60 to-be-treated object 61 resin insulating layer
62 conductive layer (wiring conductor)
63 resin insulating layer
65 via hole
Ps treatment space
S smear
W pure water

The invention claimed is:

1. A desmear treatment device for removing smear in a wiring board material including an insulating layer and a conductive layer layered on each other and being provided with a via hole or a through-hole, the desmear treatment device comprising:

an ultraviolet light source including a xenon excimer lamp for emitting vacuum ultraviolet rays with a center wavelength of 172 nm; a light irradiation chamber in which the ultraviolet light source is housed; a treatment chamber having a treatment space where a to-be-treated object is disposed; an ultraviolet transmitting window member for separating an inner space of the light irradiation chamber from the treatment space of the treatment chamber; a treatment stage having a supply port and discharge port formed at positions spaced apart from each other between which the to-be-treated object is disposed; and treatment gas supply means for supplying a treatment gas into the treatment space, wherein the treatment gas supply means includes a humidifying mechanism for causing a treatment gas, having an oxygen concentration of not lower than 50% by volume and containing active species to be activated by the vacuum ultraviolet rays from the ultraviolet light source, to contain moisture and supplies, into the treatment space, the treatment gas humidified by the humidifying mechanism to have an absolute humidity by volume within a range of 10 to 70 $g/m^3$, and the desmear treatment device further comprises a dew-point instrument for measuring a dew-point temperature of the gas discharged from the treatment space; and a control mechanism for calculating the absolute humidity by volume of the treatment gas on the basis of the dew-point temperature measured by the dew-point instrument to control an amount of moisture to be contained in the treatment gas.

2. The desmear treatment device according to claim 1, wherein the ultraviolet light source is formed by a plurality of rod-shaped ultraviolet lamps disposed side by side such that central axes of each of the plurality of ultraviolet lamps extend parallel to one another in a same horizontal plane; and the supply port and the discharge port in the treatment stage are formed at positions spaced apart from each other in the direction along which the ultraviolet lamps are arranged.

3. The desmear treatment device according to claim 1, wherein the supply port and the discharge port each have an elongated slit-shaped long opening extending along a central axes of the ultraviolet light source.

4. The desmear treatment device according to claim 3, wherein an opening area of the discharge port is larger than an opening area of the supply port.

* * * * *